United States Patent
Lim et al.

(10) Patent No.: US 9,627,304 B2
(45) Date of Patent: Apr. 18, 2017

(54) METHOD OF PRODUCING A LARGE NUMBER OF SUPPORT APPARATUS WHICH CAN BE SURFACE-MOUNTED, ARRANGEMENT OF A LARGE NUMBER OF SUPPORT APPARATUS WHICH CAN BE SURFACE-MOUNTED, AND SUPPORT APPARATUS WHICH CAN BE SURFACE-MOUNTED

(71) Applicant: OSRAM Opto Semiconductors GmbH, Regensburg (DE)

(72) Inventors: Choo Kean Lim, Penang (MY); Chee Jia Chang, Penang (MY); Choon Keat Or, Penang (MY)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/029,693

(22) PCT Filed: Oct. 17, 2013

(86) PCT No.: PCT/EP2013/071720
§ 371 (c)(1),
(2) Date: Apr. 15, 2016

(87) PCT Pub. No.: WO2015/055247
PCT Pub. Date: Apr. 23, 2015

(65) Prior Publication Data
US 2016/0268186 A1 Sep. 15, 2016

(51) Int. Cl.
*H01L 33/00* (2010.01)
*H01L 23/498* (2006.01)
(Continued)

(52) U.S. Cl.
CPC .... *H01L 23/49805* (2013.01); *H01L 21/4846* (2013.01); *H01L 21/4853* (2013.01);
(Continued)

(58) Field of Classification Search
CPC ............. H01L 21/4846; H01L 21/4853; H01L 2021/60022; H01L 2021/60067; H01L 2021/6027
(Continued)

(56) References Cited

U.S. PATENT DOCUMENTS 6,310,298 B1 10/2001 Barrett et al.
2006/0197216 A1 9/2006 Yee
(Continued)

FOREIGN PATENT DOCUMENTS

TW 1244186 B 11/2005
TW 201001578 A 1/2010
(Continued)

*Primary Examiner* — Brook Kebede
(74) *Attorney, Agent, or Firm* — DLA Piper LLP (US)

(57) ABSTRACT

A method of producing a multiplicity of surface-mountable carrier devices includes: A) providing a carrier plate having a first main face and a second main face located opposite the first main face, B) applying an electrically conductive layer to the first main face, C) applying a solder resist mask to a side of the electrically conductive layer remote from the carrier plate, wherein a multiplicity of adjoining regions are formed on the electrically conductive layer by the solder resist mask, D) applying a solder material to the solder resist mask and the electrically conductive layer, wherein the solder resist mask and the electrically conductive layer are at least partially covered by the solder material, and E) singulating the carrier plate and the electrically conductive layer along and through the solder resist mask and the solder material, wherein the solder material remains at least partially on the solder resist mask.

12 Claims, 2 Drawing Sheets

(51) Int. Cl.
  *H01L 21/48* (2006.01)
  *H01L 23/00* (2006.01)
  *H01L 33/48* (2010.01)
  *H01L 23/488* (2006.01)

(52) U.S. Cl.
  CPC ............. *H01L 24/05* (2013.01); *H01L 24/94* (2013.01); *H01L 24/95* (2013.01); *H01L 33/486* (2013.01); *H01L 23/488* (2013.01); *H01L 2924/01322* (2013.01); *H01L 2933/0033* (2013.01)

(58) Field of Classification Search
  USPC ......... 438/25, 26, 64, 106; 257/99, 676, 777
  See application file for complete search history.

(56) References Cited

U.S. PATENT DOCUMENTS

| | | | |
|---|---|---|---|
| 2007/0182029 A1* | 8/2007 | Franosch | H03H 9/0523 257/793 |
| 2007/0273046 A1* | 11/2007 | Theuss | H01L 21/561 257/783 |
| 2012/0040524 A1 | 2/2012 | Kuo et al. | |

FOREIGN PATENT DOCUMENTS

| | | |
|---|---|---|
| TW | 201207967 A | 2/2012 |
| WO | 2009/130442 A1 | 10/2009 |

\* cited by examiner

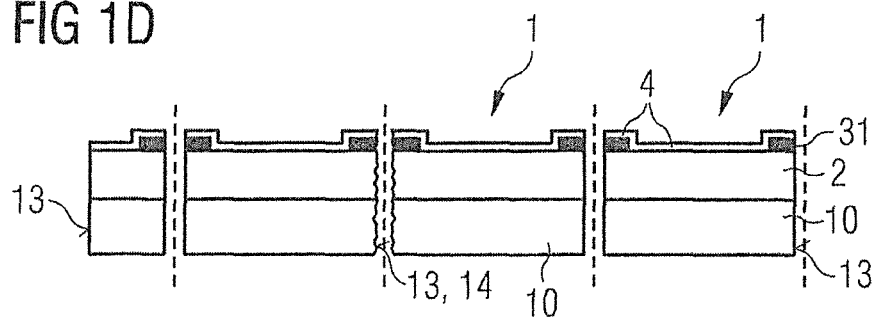
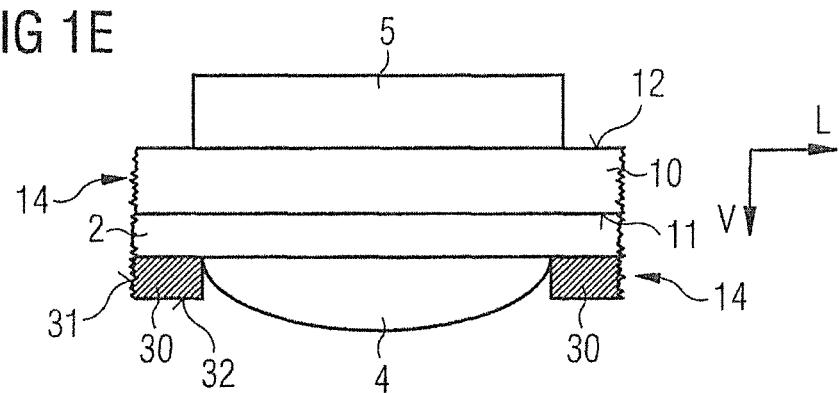
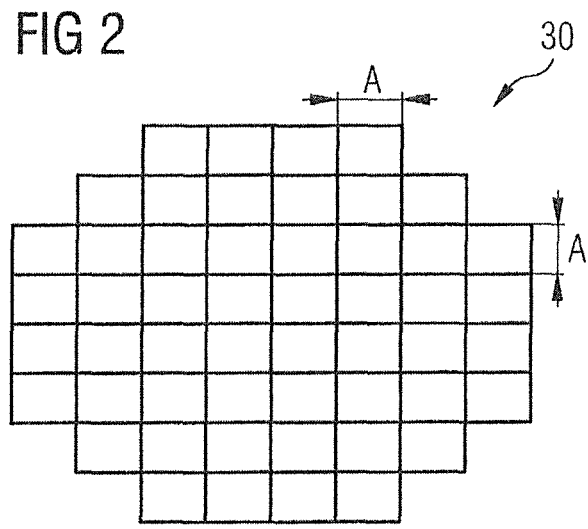

METHOD OF PRODUCING A LARGE NUMBER OF SUPPORT APPARATUS WHICH CAN BE SURFACE-MOUNTED, ARRANGEMENT OF A LARGE NUMBER OF SUPPORT APPARATUS WHICH CAN BE SURFACE-MOUNTED, AND SUPPORT APPARATUS WHICH CAN BE SURFACE-MOUNTED

TECHNICAL FIELD

This disclosure relates to a method of producing a multiplicity of surface-mountable carrier devices and, furthermore, relates to an arrangement of a multiplicity of surface-mountable carrier devices and a surface-mountable carrier device.

BACKGROUND

It could be helpful to provide a method of producing a multiplicity of surface-mountable carrier devices which is particularly material-saving and cost-efficient as well as to provide an arrangement of a multiplicity of surface-mountable carrier devices and a surface-mountable carrier device having a particularly simple construction.

SUMMARY

We provide a method of producing a multiplicity of surface-mountable carrier devices including A) providing a carrier plate having a first main face and a second main face located opposite the first main face, B) applying an electrically conductive layer to the first main face of the carrier plate, C) applying a solder resist mask to a side of the electrically conductive layer remote from the carrier plate, wherein a multiplicity of adjoining regions are formed on the electrically conductive layer by the solder resist mask, D) applying a solder material to the solder resist mask and the electrically conductive layer, wherein the solder resist mask and the electrically conductive layer are covered by the solder material at least in places, and E) singulating the carrier plate and the electrically conductive layer along and through the solder resist mask and the solder material, wherein the solder material remains on the solder resist mask at least in places.

We also provide an arrangement of a multiplicity of surface-mountable carrier devices including a carrier plate having a first main face and a second main face located opposite the first main face, an electrically conductive layer, a solder resist mask, and a solder material, wherein the electrically conductive layer completely covers the first main face of the carrier plate, the solder resist mask is arranged on a side of the electrically conductive layer remote from the carrier plate, side walls of the solder resist mask are at a spacing (A) in relation to one another in a lateral direction and the electrically conductive layer is free of the solder resist mask at least in places, and the solder material from a side remote from the carrier plate covers the electrically conductive layer and the solder resist mask at least in places, wherein the solder material is in direct contact with the electrically conductive layer and the solder resist mask.

We further provide a surface-mountable carrier device including a carrier plate having a first main face and a second main face located opposite the first main face, the first main face connects to the second main face via a side face, an electrically conductive layer, a solder resist mask, and a solder material, wherein the electrically conductive layer covers the first main face of the carrier plate at least in places and the electrically conductive layer terminates flush with the side face of the carrier plate, the solder resist mask is arranged on a side of the electrically conductive layer remote from the carrier plate, side walls of the solder resist mask are at a spacing (A) in relation to one another in a lateral direction and the electrically conductive layer is free of the solder resist mask at least in places, wherein the side walls of the solder resist mask terminate flush with the side face of the carrier plate and the electrically conductive layer, the solder material is in direct contact with the electrically conductive layer at least in places, wherein the solder resist mask is free of the solder material on a face remote from the carrier plate, the solder resist mask includes an electrically conductive material, the solder resist mask delimits the solder material in the lateral direction, and the solder material protrudes beyond the solder resist mask in the vertical direction (V) in places.

BRIEF DESCRIPTION OF THE DRAWINGS

FIGS. 1A, 1B, 1C, 1D and 1E show schematic illustrations of individual method steps of producing a multiplicity of surface-mountable carrier devices. FIG. 1C in this respect shows a schematic illustration of an arrangement of a multiplicity of surface-mountable carrier devices. FIG. 1E furthermore shows a schematic illustration of a surface-mountable carrier device.

FIG. 2 shows a schematic illustration of an example of a solder resist mask.

DETAILED DESCRIPTION

Figure 1A:
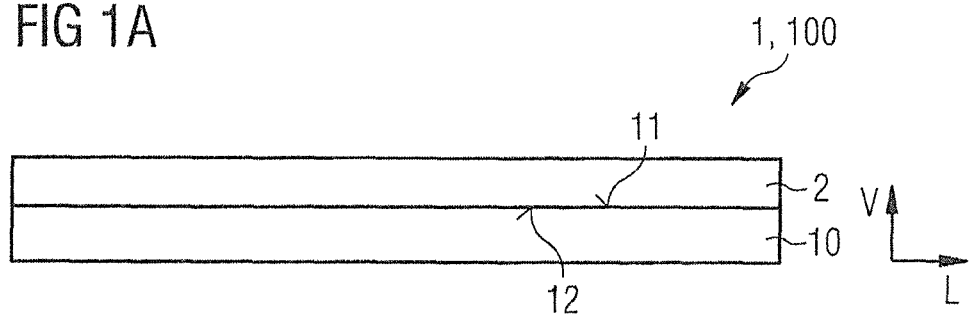

Our method of producing a multiplicity of surface-mountable carrier devices may include a step A a carrier plate having a first main face and a second main face located opposite the first main face. The carrier plate can have a single-piece form. For the purposes of a manufacturing tolerance, the first and second main faces can in particular have a planar form and extend parallel to one another. The first and the second main faces then do not have any interruptions, elevations and/or recesses. The carrier plate can have a self-supporting form. By way of example, the carrier plate does not require any further mechanically supportive components. The first and the second main faces of the carrier plate comprise the same material, for example. The carrier plate may be suitable, for example, to mount an electronic and/or an optoelectronic component. By way of example, the optoelectronic component is an optoelectronic semiconductor chip. The optoelectronic semiconductor chip can generate or receive electromagnetic radiation, for example. By way of example, the optoelectronic semiconductor chip is a luminescence diode chip, for instance a light-emitting diode chip or a laser diode chip.

In a step B an electrically conductive layer may be applied to the first main face of the carrier plate. The electrically conductive layer can be applied to the first main face of the carrier plate in particular by sputtering, vapor deposition and/or by a galvanic method. The electrically conductive layer can comprise an electrically conductive material or an electrically conductive alloy or can consist of one of these materials. The electrically conductive layer is in particular in direct contact with the first main face of the carrier plate. By way of example, no further layer or a material is arranged between the carrier plate and the electrically conductive layer.

In a step C a solder resist mask may be applied to a side of the electrically conductive layer remote from the carrier plate, wherein a multiplicity of adjoining regions are formed on the electrically conductive layer by the solder resist mask. The adjoining regions on the electrically conductive layer can be delimited or separated by side walls of the solder resist mask. The side walls of the solder resist mask can connect to one another by a face of the solder resist mask remote from the carrier plate. The side walls of the solder resist mask are suitable in particular to delimit a material, for example, a solder material at least in places on the electrically conductive layer.

The solder resist mask can in particular comprise an electrically conductive material or consist thereof. The solder resist mask laterally delimits the electrically conductive layer. "Lateral" means those directions extending parallel to a principal plane of the extent of the electrically conductive layer. A face of the electrically conductive layer delimited by the solder resist mask may be free of the solder resist mask, for example. The solder resist mask can be applied to the electrically conductive layer in particular by a screen printing method, spraying method or by ink-jet technology.

In a step D a solder material may be applied to the solder resist mask and the electrically conductive layer, wherein the solder resist mask and the electrically conductive layer are covered by the solder material at least in places. By way of example, the solder material completely covers the solder resist mask and the electrically conductive layer. The solder material is, for example, in direct contact with the solder resist mask and the electrically conductive layer. In particular, the solder material covers the solder resist mask and the electrically conductive layer in a conformal manner. "Conformal" means that the solder material adapts to the patterning predefined by the solder resist mask on the electrically conductive layer. That is to say that the solder material adapts to the topography predefined by the solder resist mask on the electrically conductive layer and reshapes the topography on an underside of the carrier plate to which the electrically conductive layer is also applied.

In a step E the carrier plate and the electrically conductive layer may be singulated along and through the solder resist mask and the solder material, wherein the solder material remains on the solder resist mask at least in places. The singulation can be effected, for example, by mechanical separation, for example, sawing and/or laser separation. The singulation can be effected vertically in relation to the lateral direction. By way of example, a saw blade and/or laser beam encloses a right angle with the first main face of the carrier plate. In particular, after singulation, the solder material is in direct contact with all of the exposed outer faces of the solder resist mask and the electrically conductive layer remote from the carrier plate.

The method may be carried out in a sequence A to E as specified here.

In a method of producing a multiplicity of surface-mountable carrier devices, in a step A a carrier plate may have a first main face and a second main face located opposite the first main face. In a step B, an electrically conductive layer may be applied to the first main face of the carrier plate. In a next step, step C, a solder resist mask may be applied to a side of the electrically conductive layer remote from the carrier plate, wherein a multiplicity of adjoining regions are formed on the electrically conductive layer by the solder resist mask. In a step D, a solder material may be applied to the solder resist mask and the electrically conductive layer, wherein the solder resist mask and the electrically conductive layer are covered by the solder material at least in places. In a step E, the carrier plate and the electrically conductive layer may be singulated along and through the solder resist mask and the solder material, wherein the solder material remains on the solder resist mask at least in places.

We also provide an arrangement of a multiplicity of surface-mountable carrier devices and a surface-mountable carrier device. By way of example, the arrangement of a multiplicity of surface-mountable carrier devices and the surface-mountable carrier device can be produced in particular by the method described herein. That is to say that the features mentioned for the method described herein are also disclosed for the arrangement of a multiplicity of surface-mountable carrier devices and the surface-mountable carrier device described herein, and vice versa.

The arrangement of a multiplicity of surface-mountable carrier devices may comprise the carrier plate, the electrically conductive layer, the solder resist mask and the solder material.

In the arrangement of a multiplicity of surface-mountable carrier devices, the electrically conductive layer may cover the first main face of the carrier plate at least in places.

In the arrangement of a multiplicity of surface-mountable carrier devices, the solder resist mask may be arranged on a side of the electrically conductive layer remote from the carrier plate.

In the arrangement of a multiplicity of surface-mountable carrier devices, the side walls of the solder resist mask may be at the spacing in relation to one another in the lateral direction and the electrically conductive layer may be free of the solder resist mask at least in places. By way of example, the lateral direction extends parallel to the first main face of the carrier plate. By way of example, opposing side walls of the solder resist mask are at a constant spacing in the lateral direction. By way of example, the solder resist mask delimits square regions on the electrically conductive layer. Those regions of the electrically conductive layer not covered by the solder resist mask can be entirely free of the solder resist mask.

In the arrangement of a multiplicity of surface-mountable carrier devices, the solder material from the side remote from the carrier plate may cover the electrically conductive layer and the solder resist mask at least in places. By way of example, the solder material can be in direct contact with the electrically conductive layer and the solder resist mask.

The arrangement may comprise the carrier plate having the first main face and the second main face located opposite the first main face, the electrically conductive layer, the solder resist mask, and the solder material, wherein the electrically conductive layer covers the first main face of the carrier plate at least in places, the solder resist mask is arranged on that side of the electrically conductive layer remote from the carrier plate, the side walls of the solder resist mask are at the spacing in relation to one another in the lateral direction and the electrically conductive layer is free of the solder resist mask at least in places, and the solder material from the side remote from the carrier plate covers the electrically conductive layer and the solder resist mask at least in places.

In the method, after step E, the surface-mountable carrier device may be heated. The surface-mountable carrier device can be heated, for example, by a thermal contact on the second main face of the carrier plate, and this can then be passed on via the electrically conductive layer in the direction of the solder material. The thermal contact can be formed, for example, by attaching the surface-mountable carrier device on a hot plate. Furthermore, the surface-mountable carrier device can be heated by infrared radiation or laser radiation. In particular, methods used in reflow soldering can be used for the heating.

In the method, the solder material may flow from the solder resist mask in the direction of the electrically conductive layer. As a result of the heating, the solder material melts and becomes detached from the solder resist mask to which it adheres less effectively than to the electrically conductive layer. This can be attributed to the fact that on the one hand the solder material wets the solder resist mask poorly and, on the other hand, on account of surface tension, the solder material coalesces in those regions on the electrically conductive layer delimited by the solder resist mask. The molten solder material therefore flows in the direction of the electrically conductive layer.

The solder material may be delimited in the lateral direction by the solder resist mask. As a result of this, the solder material can come together uniformly and an uncontrolled flow of the solder material on the electrically conductive layer is prevented.

That face of the solder resist mask remote from the carrier plate may be freed of the solder material. Particularly as a result of the heating, described here, of the surface-mountable carrier device, the solder material melts and flows in the direction of the electrically conductive layer. The flow of the solder material can be attributed, in particular, to surface tension of the solder material. By way of example, those faces of the solder resist mask extending parallel to the electrically conductive layer are completely free, within the scope of the manufacturing tolerance, of the solder material.

In the method, after step E, the surface-mountable carrier device may be heated. The solder material flows from the solder resist mask in the direction of the electrically conductive layer, wherein the solder material is delimited in the lateral direction by the solder resist mask. Furthermore, that face of the solder resist mask remote from the carrier plate is freed of the solder material.

The additional method steps carried out after step E of the method produce, in particular, a surface-mountable carrier device described here. The surface-mountable carrier device can be arranged on a printed circuit board, for example, by the solder material.

The carrier device may comprise a side face connecting the first main face and the second main face to one another. The side face may have a continuous form and extends, for example, transversely, in particular perpendicularly, in relation to the main direction of extent of the first main faces. The side face furthermore does not have any interruptions and/or elevations.

In the surface-mountable carrier device, the electrically conductive layer may terminate flush with the side face of the carrier plate. The electrically conductive layer may form a common planar face with the side face of the carrier plate, this being attributable to the singulation of the arrangement of a multiplicity of surface-mountable carrier devices.

The side walls of the solder resist mask may terminate flush with the side face of the carrier plate and the electrically conductive layer. The side face of the carrier plate, the electrically conductive layer and the side walls of the solder resist mask can form a further common planar face, for example, this face comprising in particular a material of the solder resist mask, a material of the electrically conductive layer and a material of the carrier plate.

The solder material may be in direct contact with the electrically conductive layer at least in places. No further layer and/or material is arranged between the solder material and the electrically conductive layer.

The solder resist mask may be free, within the scope of the manufacturing tolerance, of the solder material on that face remote from the carrier plate. However, the side walls of the solder resist mask delimiting the solder material in the lateral direction can be in direct contact with the solder material at least in places.

The solder resist mask may delimit the solder material in the lateral direction.

The solder material may protrude beyond the solder resist mask in the vertical direction in places. The vertical direction extends perpendicularly or transversely in relation to the lateral direction. The solder material, which collects on the electrically conductive layer on account of its surface tension and can be delimited by the side walls of the solder resist mask, can form, for example, a geometrical shape similar to a hemisphere. In this case, area segments of the hemisphere not terminating flush with that face of the solder resist mask remote from the carrier plate and which are remote from the electrically conductive layer protrude beyond the side walls of the solder resist mask in the vertical direction. As a result of this, the surface-mountable carrier device can be contact-connected, connected and/or arranged directly on a printed circuit board in a mechanically stable manner.

The carrier device may comprise the carrier plate having the first main face and the second main face located opposite the first main face. Furthermore, the first main face connects to the second main face via a side face. Moreover, the surface-mountable carrier device comprises the electrically conductive layer, the solder resist mask, and the solder material. The electrically conductive layer covers the first main face of the carrier plate at least in places and the electrically conductive layer terminates flush with the side face of the carrier plate. The solder resist mask is arranged on a side of the electrically conductive layer remote from the carrier plate. Furthermore, the surface-mountable carrier device comprises the side walls of the solder resist mask at the spacing in relation to one another in the lateral direction, wherein the electrically conductive layer is free of the solder resist mask at least in places, and the side walls of the solder resist mask terminate flush with the side face of the carrier plate and the electrically conductive layer. The solder material is in direct contact with the electrically conductive layer at least in places. The solder resist mask is free of the solder material on a face remote from the carrier plate, wherein the solder resist mask delimits the solder material in the lateral direction, and the solder material protrudes beyond the solder resist mask in the vertical direction in places.

We provide a method of producing a multiplicity of surface-mountable carrier devices which makes use, inter alia, of the concept of applying a solder material simultaneously to a solder resist mask and an electrically conductive layer. We surprisingly established in such a structure that the solder material becomes detached from the solder resist mask upon heating the carrier device and can form an electrically conductive contact-connection with the electrically conductive layer on account of surface tension of the solder material. As a result of this, it is possible in particular for very small surface-mountable carrier devices to be produced, with smearing of the solder material being avoided particularly in small structures or close-meshed solder resist masks.

The following examples refer to the optoelectronic arrangement and also to the method.

The side face of the carrier plate may have traces of a physical and/or mechanical material removal. The traces of the physical and/or mechanical material removal form in particular on the side face of the carrier plate as a result of the singulation of the carrier plate and of the electrically conductive layer along and through the solder resist mask, or of the solder material. Furthermore, these traces are also detectable on the corresponding side walls of the solder resist layer or else on the electrically conductive layer. The traces of the physical material removal may be attributable to a laser separation method. The traces of the mechanical material removal may arise as a result of sawing and/or cutting.

The solder resist mask may comprise an electrically conductive material. If the solder resist mask comprises or consists of the electrically conductive material, the solder resist mask forms a particularly stable bond with the underlying electrically conductive layer. In particular, this stable bond contributes to the fact that the solder resist mask does not become detached from the electrically conductive layer during the singulation.

The solder resist mask may comprise chromium. In particular, the solder resist mask may consist of chromium. We surprisingly found that the solder material becomes detached from the chromium particularly readily on account of its surface tension during heating, with the solder material wetting the chromium before heating at least in places, in particular completely.

The solder resist mask may have a lattice-like structure. By way of example, the surface-mountable carrier devices have the same lateral extents on the basis of the lattice-like structure of the solder resist mask. In other words, surface-mountable carrier devices of the same size are produced by the lattice-like structure of the solder resist mask. Furthermore, in a solder resist mask having such a homogeneous structure, the singulation can be automated.

The spacing between the side walls of the solder resist mask in the lateral direction may be at least 200 µm. In particular, the spacing between the side walls of the solder resist mask in the lateral direction may be 200 µm to 1400 µm. Furthermore, the spacing can be varied depending on a lateral extent of a component arranged on the second main face of the carrier plate.

An optoelectronic semiconductor chip may be arranged on the second main face of the carrier plate. The optoelectronic semiconductor chip may be a light-emitting diode chip, for example. During operation, the light-emitting diode chip can generate electromagnetic radiation. During operation, the light-emitting diode chip generates, for example, an infrared, visible and/or ultraviolet electromagnetic radiation. The optoelectronic semiconductor chip can be electrically contact-connected, in particular, on a printed circuit board in particular by the surface-mountable carrier device.

The carrier plate may comprise a Si, a SiC and/or a Ge. In particular, the carrier plate may consist of Si, SiC and/or a Ge. These materials are particularly readily suitable for integration of electrically conductive contact points and/or conductor tracks.

The solder material may comprise an eutectic Au/Sn alloy. In particular, the solder material may consist of an eutectic Au/Sn alloy. The eutectic Au/Sn alloy is distinguished by a direct phase transition from solid to liquid. No molten masses of the solder material consisting of different phases are thus formed. In particular, the solder material can be converted particularly quickly into the liquid state. The surface-mountable carrier device can therefore be heated in a particularly energy-saving manner.

The electrically conductive layer may comprise an Au and/or an Ag. In particular, the electrically conductive layer may consist of Au or Ag. In particular, the electrically conductive layer comprising Au and/or Ag forms a particularly chemically homogeneous and mechanically stable bond with the solder material comprising the Au/Sn alloy. That is to say if the surface-mountable carrier device comprises the electrically conductive layer of Au or Ag and the eutectic Au/Sn alloy, a soldered connection between the surface-mountable carrier device and a printed circuit board can be particularly stable.

In the figures, elements that are identical, identical in nature or have an identical effect are provided with the same reference signs. The figures and the proportions in terms of size among the elements shown in the figures are not to be considered as true to scale. Instead, it may be that individual elements are shown in an exaggerated size for better illustration and/or for better understanding.

The example of FIG. 1A shows a carrier plate 10 having a first main face 11 and a second main face 12 located opposite the first main face 11. The first main face 11 and the second main face 12 extend parallel to one another and do not have any indentations and/or protrusions. In FIG. 1A, an electrically conductive layer 2 has been applied to the first main face 11 of the carrier plate 10. The electrically conductive layer 2 is in direct contact with the first main face 11 of the carrier plate 10 and covers the main face 11 completely.

The electrically conductive layer 2 can comprise, for example, an Au and/or an Ag or consist of one of these materials.

Figure 1B:
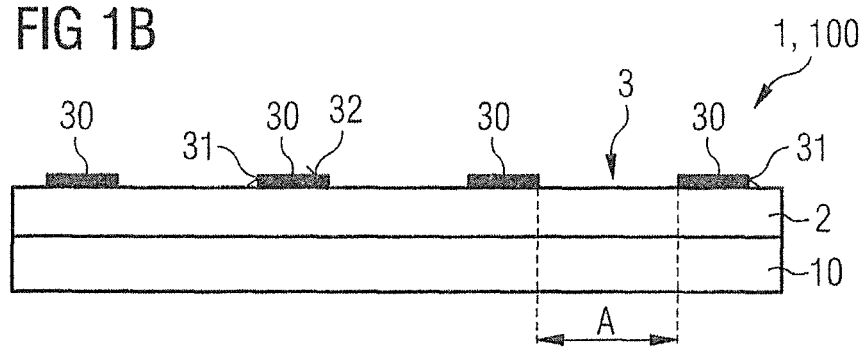

In the example of FIG. 1B, a solder resist mask 30 has been applied to a side of the electrically conductive layer 2 remote from the carrier plate 10, with a multiplicity of adjoining regions 3 being formed on the electrically conductive layer 2 by the solder resist mask 30. The solder resist mask 30 comprises side walls 31 and a face 32 connecting the side walls. The face 32 faces in a direction counter to the carrier plate 10. The adjoining regions 3 shown in FIG. 1B are at an identical spacing A in the lateral direction L.

Figure 1C:
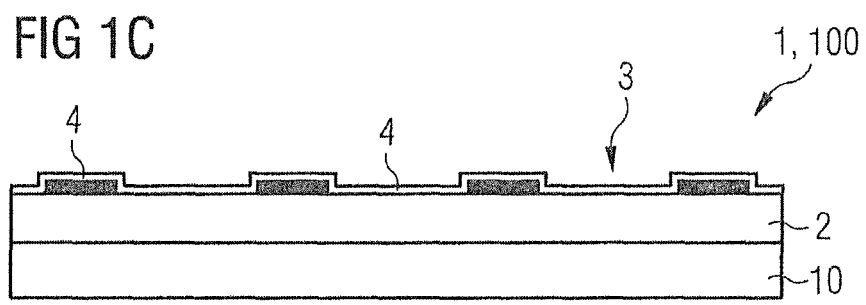

FIG. 1C shows an example of an arrangement of a multiplicity of the surface-mountable carrier devices 100.

In the example of FIG. 1C, a solder material 4 has been applied to the solder resist mask 30 and the electrically conductive layer 2. In FIG. 1C, the solder resist mask and the electrically conductive layer 2 are completely covered by the solder material 4. That is to say that all exposed faces of the electrically conductive layer 2 and the solder resist mask 30 remote from the carrier plate 10 are exclusively in direct contact with the solder material 4. In this case, the solder resist mask 30 can comprise chromium. The solder material can comprise an eutectic Au/Sn alloy. The electrically conductive layer 2 can comprise Au, for example.

FIG. 1D shows an example of the surface-mountable carrier device 1.

In the example of FIG. 1D, the carrier plate 10 and the electrically conductive layer 2 have been singulated along and through the solder resist mask 30 and the solder material 4. The first main face 11 and the second main face 12 connect by a side face 13 of the carrier plate. The side face 13 connects the first main face 11 and the second main face 12 in the vertical direction V. The side walls 31 of the solder resist mask 30 and the electrically conductive layer 2 terminate flush with the side face 13 of the carrier plate 10. In this respect, the solder material 4 continues to remain on the solder resist mask 30. The solder material 4 does not become detached from the solder resist mask 30 during singulation. That is to say that the solder material 4 remains in direct contact with the solder resist mask 30. Furthermore, the side face 13 of the carrier plate, the electrically conductive layer 2 and the side walls 31 of the solder resist mask have traces of a physical and/or mechanical material removal 14. The face 32 of the solder resist mask 30 is free of the traces of a physical and/or mechanical material removal 14.

The example of FIG. 1E shows the surface-mountable carrier device 1 after heating. The surface-mountable carrier device 1 can be heated, for example, by thermal contacting of the carrier plate 10 and/or of the electrically conductive layer 2. The solder material 4 then flows in the liquid state from the solder resist mask 30 in the direction of the electrically conductive layer 2. The solder material 4, which covers and/or wets the solder resist mask up until the heating, then becomes detached from the solder resist mask and flows on account of a material-specific surface tension of the solder material 4 in the direction of the electrically conductive layer 2. As shown in FIG. 1E, the solder material 4 is then delimited in the lateral direction L by the solder resist mask 30, and faces of the solder resist mask 30 remote from the carrier plate 10 are free of the solder material 4. Furthermore, the solder material 4 protrudes beyond the solder resist mask 30 in the vertical direction V. A direct contact connection of the surface-mountable carrier device 1 on, for example, a carrier plate is therefore possible. An optoelectronic semiconductor chip 5 shown in FIG. 1E can be arranged in particular on the second main face 12.

FIG. 2 shows a schematic top view of a solder resist mask. The solder resist mask has a lattice-like structure. That is to say that the side walls of the solder resist mask can be at identical spacings in relation to one another in the lateral directions.

The description with reference to the examples does not limit this disclosure. Instead, the disclosure encompasses any new feature and also any combination of features, this including in particular any combination of features in the appended claims, even if the feature or combination itself is not explicitly cited in the claims or examples.

We claim:

1. A method of producing a multiplicity of surface-mountable carrier devices comprising:
   A) providing a carrier plate having a first main face and a second main face located opposite the first main face;
   B) applying an electrically conductive layer to the first main face of the carrier plate;
   C) applying a solder resist mask to a side of the electrically conductive layer remote from the carrier plate, wherein a multiplicity of adjoining regions are formed on the electrically conductive layer by the solder resist mask;
   D) applying a solder material to the solder resist mask and the electrically conductive layer, wherein the solder resist mask and the electrically conductive layer are covered by the solder material at least in places; and
   E) singulating the carrier plate and the electrically conductive layer along and through the solder resist mask and the solder material, wherein the solder material remains on the solder resist mask at least in places.

2. The method according to claim 1, wherein,
   after step E, the surface-mountable carrier device is heated,
   the solder material flows from the solder resist mask in the direction of the electrically conductive layer,
   the solder material is delimited in the lateral direction by the solder resist mask, and
   a face of the solder resist mask remote from the carrier plate is freed of the solder material.

3. An arrangement of a multiplicity of surface-mountable carrier devices comprising:
   a carrier plate having a first main face and a second main face located opposite the first main face;
   an electrically conductive layer;
   a solder resist mask; and
   a solder material, wherein
   the electrically conductive layer completely covers the first main face of the carrier plate,
   the solder resist mask is arranged on a side of the electrically conductive layer remote from the carrier plate,
   side walls of the solder resist mask are at a spacing (A) in relation to one another in a lateral direction and the electrically conductive layer is free of the solder resist mask at least in places, and
   the solder material from a side remote from the carrier plate covers the electrically conductive layer and the solder resist mask at least in places, wherein the solder material is in direct contact with the electrically conductive layer and the solder resist mask.

4. A surface-mountable carrier device comprising:
   a carrier plate having a first main face and a second main face located opposite the first main face;
   the first main face connects to the second main face via a side face;
   an electrically conductive layer;
   a solder resist mask; and
   a solder material, wherein
   the electrically conductive layer covers the first main face of the carrier plate at least in places and the electrically conductive layer terminates flush with the side face of the carrier plate,
   the solder resist mask is arranged on a side of the electrically conductive layer remote from the carrier plate,
   side walls of the solder resist mask are at a spacing (A) in relation to one another in a lateral direction and the electrically conductive layer is free of the solder resist mask at least in places, wherein
   the side walls of the solder resist mask terminate flush with the side face of the carrier plate and the electrically conductive layer,
   the solder material is in direct contact with the electrically conductive layer at least in places, wherein
   the solder resist mask is free of the solder material on a face remote from the carrier plate,
   the solder resist mask comprises an electrically conductive material,
   the solder resist mask delimits the solder material in the lateral direction, and
   the solder material protrudes beyond the solder resist mask in the vertical direction (V) in places.

5. The surface-mountable carrier device according to claim 4, wherein the side face of the carrier plate has traces of a physical and/or mechanical material removal.

6. The surface-mountable carrier device according to claim 4, wherein the solder resist mask comprises chromium.

7. The surface-mountable carrier device according to claim 4, wherein the solder resist mask has a lattice shaped structure.

8. The surface-mountable carrier device according to claim 4, wherein the spacing (A) between the side walls of the solder resist mask in the lateral direction is at least 200 µm.

9. The surface-mountable carrier device according to claim 4, wherein an optoelectronic semiconductor chip is arranged on the second main face of the carrier plate.

10. The surface-mountable carrier device according to claim 4, wherein the carrier plate comprises at least one of Si, SiC and Ge.

11. The surface-mountable carrier device according to claim 4, wherein the solder material comprises an eutectic Au/Sn alloy.

12. The surface-mountable carrier device according to claim 4, wherein the electrically conductive layer comprises an Au and/or Ag.

\* \* \* \* \*